US011226529B2

(12) United States Patent
Yoshida et al.

(10) Patent No.: US 11,226,529 B2
(45) Date of Patent: Jan. 18, 2022

(54) LIQUID CRYSTAL DISPLAY DEVICE

(71) Applicant: Sharp Kabushiki Kaisha, Sakai (JP)

(72) Inventors: Keisuke Yoshida, Sakai (JP); Kohhei Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/935,239

(22) Filed: Jul. 22, 2020

(65) Prior Publication Data
US 2021/0026211 A1 Jan. 28, 2021

Related U.S. Application Data

(60) Provisional application No. 62/878,772, filed on Jul. 26, 2019.

(51) Int. Cl.
G02F 1/136 (2006.01)
G02F 1/1362 (2006.01)
G02F 1/1368 (2006.01)
G02F 1/1333 (2006.01)
G02F 1/1339 (2006.01)
G02F 1/1335 (2006.01)
G02F 1/1337 (2006.01)

(52) U.S. Cl.
CPC ...... *G02F 1/136286* (2013.01); *G02F 1/1337* (2013.01); *G02F 1/1368* (2013.01); *G02F 1/13394* (2013.01); *G02F 1/133345* (2013.01); *G02F 1/133512* (2013.01); *G02F 2202/10* (2013.01)

(58) Field of Classification Search
CPC .......... G02F 1/136286; G02F 1/13345; G02F 1/133512; G02F 1/1337; G02F 1/13394; G02F 1/1368; G02F 2202/10
USPC .......................................................... 349/46
See application file for complete search history.

(56) References Cited

U.S. PATENT DOCUMENTS

| 2010/0201933 A1* | 8/2010 | Sonoda ............. G02F 1/133305 349/141 |
| 2012/0138922 A1 | 6/2012 | Yamazaki et al. |
| 2013/0320334 A1 | 12/2013 | Yamazaki et al. |
| 2014/0286076 A1 | 9/2014 | Aoki et al. |
| 2017/0090229 A1 | 3/2017 | Imai et al. |

(Continued)

FOREIGN PATENT DOCUMENTS

| JP | 2012-134475 A | 7/2012 |
| JP | 2014-007399 A | 1/2014 |

(Continued)

*Primary Examiner* — Nathanael R Briggs
*Assistant Examiner* — William D Peterson
(74) *Attorney, Agent, or Firm* — Keating & Bennett, LLP

(57) ABSTRACT

A liquid crystal display device includes an active matrix substrate, a counter substrate, and a liquid crystal layer. The active matrix substrate includes a top gate type oxide semiconductor TFT a plurality of gate wiring lines a plurality of source and an interlayer insulating layer The counter substrate includes a plurality of columnar spacers provided on a second substrate. Each columnar spacer is disposed in an intersecting region where the gate wiring line and the source wiring line intersect. A front face of the active matrix substrate on the liquid crystal layer side includes a plurality of first ridges overlapping the plurality of gate wiring lines and a plurality of second ridges overlapping the plurality of source wiring lines.

17 Claims, 13 Drawing Sheets

(56) References Cited

U.S. PATENT DOCUMENTS

2017/0285393 A1* 10/2017 Kim ................. H01L 29/24
2019/0196257 A1*  6/2019 Tae ................ G02F 1/134336

FOREIGN PATENT DOCUMENTS

| JP | 2014-209727 A | 11/2014 |
| JP | 2015-109315 A | 6/2015 |
| WO | 2015/186619 A1 | 12/2015 |

* cited by examiner

LIQUID CRYSTAL DISPLAY DEVICE

TECHNICAL FIELD

The present invention relates to a liquid crystal display device.

BACKGROUND ART

A liquid crystal display device that is widely used includes an active matrix substrate provided with switching elements on a pixel-by-pixel basis. An active matrix substrate including thin film transistors (hereinafter referred to as a "TFT") as the switching elements is referred to as a TFT substrate.

In recent years, there has been proposed use of an oxide semiconductor as a material of an active layer of the TFT, in place of amorphous silicon and polycrystalline silicon. Such a TFT is referred to as an "oxide semiconductor TFT." The oxide semiconductor has mobility higher than that of amorphous silicon. Thus, the oxide semiconductor TFT can operate at a higher speed than an amorphous silicon TFT. In addition, since an oxide semiconductor film is formed by a process simpler than that of a polycrystalline silicon film, the oxide semiconductor film can be applied to a device that requires a large area.

The oxide semiconductor TFT was initially developed on the basis of the structure of the amorphous silicon TFT, and therefore the bottom gate type is the mainstream. Nevertheless, in a bottom gate type oxide semiconductor TFT, an upper portion of the channel is open, and thus there is a problem in that the TFT characteristics readily deteriorate due to the effects of impurities and electric fields from the film layered above. Therefore, in recent years, a top gate type oxide semiconductor TFT has been developed.

A top gate type oxide semiconductor TFT is disclosed in JP 2015-109315 A, for example. In the oxide semiconductor TFT disclosed in JP 2015-109315 A, a gate electrode is disposed on a portion of an oxide semiconductor layer with a gate insulating layer interposed therebetween, and source and drain electrodes are disposed on an insulating layer covering the gate electrode.

In the top gate type, a gate wiring line formed of the same conductive film (gate metal film) as the gate electrode is positioned above the oxide semiconductor layer. Therefore, in a case where the source wiring line (formed of the same conductive film (source metal film) as the source electrode) is disposed in an upper layer above the gate wiring line, a contact hole for connecting the source electrode and the oxide semiconductor layer needs to penetrate the insulating layers above and below the gate electrode, and thus a deep hole is formed. This adversely affects scaling down pixel pitch and flattening the substrate surface. Further, when film residue occurs when patterning the gate metal film, there is a risk that line defects will occur and yield will decline.

In WO 2015/186619, there is proposed a substrate structure (hereinafter referred to as a "lower source structure") in which a source electrode and a source wiring line are provided closer to the substrate (lower layer) than the gate wiring line and the oxide semiconductor layer. In an active matrix substrate having the lower source structure, the contact hole for connecting the source electrode and the oxide semiconductor layer is unnecessary or may be a shallow small hole. Further, the decline in yield due to the film residue of the gate metal film does not occur, which is advantageous from the perspective of increasing precision and improving yield.

SUMMARY OF INVENTION

In a typical liquid crystal display device, a columnar spacer (photo spacer) for defining a cell gap is provided to a counter substrate facing an active matrix substrate. When the position of the columnar spacer deviates due to stress externally applied to the liquid crystal display device, scratches caused by the columnar spacer may occur in the alignment film on the active matrix substrate side. The scratches occurring on the alignment film cause a reduction in display quality.

According to research by the inventors of the present application, it was found that, in a case where a lower source structure such as described above is adopted in the active matrix substrate, as described in detail later, it is difficult to prevent the occurrence of scratches in the alignment film caused by the columnar spacer.

An embodiment of the present invention has been made in view of the problems described above, and an object of an embodiment of the present invention is to suppress the occurrence of scratches in an alignment film caused by a columnar spacer in a liquid crystal display device provided with an active matrix substrate having a lower source structure including a top gate type oxide semiconductor TFT.

The present specification discloses a liquid crystal display device according to the following items.

Item 1

A liquid crystal display device including a plurality of pixels arranged in a matrix shape including a plurality of rows and a plurality of columns includes:

an active matrix substrate;

a counter substrate facing the active matrix substrate; and a liquid crystal layer provided between the active matrix substrate and the counter substrate, wherein the active matrix substrate includes a first substrate, an oxide semiconductor TFT supported by the first substrate, disposed in each of the plurality of pixels, and including an oxide semiconductor layer, a gate insulating layer provided on the oxide semiconductor layer, and a gate electrode facing the oxide semiconductor layer with the gate insulating layer interposed therebetween, a plurality of gate wiring lines formed of the same conductive film as the gate electrode and extending in a row direction, a plurality of source wiring lines extending in a column direction and positioned closer to the first substrate than to the plurality of gate wiring lines, an interlayer insulating layer covering the plurality of gate wiring lines and the oxide semiconductor TFT, and a first alignment film that comes into contact with the liquid crystal layer, the counter substrate includes a second substrate, a plurality of columnar spacers provided on the second substrate, and a second alignment film that comes into contact with the liquid crystal layer, each of the plurality of columnar spacers is disposed in an intersecting region where any one of the plurality of gate wiring lines and any one of the plurality of source wiring lines intersect, and a front face of the active matrix substrate on the liquid crystal layer side includes a plurality of first ridges overlapping the plurality of gate wiring lines when viewed from a normal direction of the display surface, and a plurality of second ridges overlapping the plurality of source wiring lines when viewed from the normal direction of the display surface.

Item 2

The liquid crystal display device according to Item 1, in which a height of each of the plurality of second ridges is greater than or equal to a height of each of the plurality of first ridges.

Item 3

The liquid crystal display device according to Item 1, in which a height of each of the plurality of second ridges is greater than a height of each of the plurality of first ridges.

Item 4

The liquid crystal display device according to any one of Items 1 to 3, in which the active matrix substrate further includes a plurality of base conductive layers provided below the interlayer insulating layer and overlapping the plurality of second ridges when viewed from the normal direction of the display surface.

Item 5

The liquid crystal display device according to Item 4, in which the plurality of base conductive layers are formed of the same conductive film as the plurality of gate wiring lines.

Item 6

The liquid crystal display device according to Item 5, in which the plurality of base conductive layers are not electrically connected to the plurality of gate wiring lines.

Item 7

The liquid crystal display device according to Item 4, in which the plurality of base conductive layers are formed of a conductive film different from that of the plurality of gate wiring lines.

Item 8

The liquid crystal display device according to Item 7, in which a thickness of each of the plurality of base conductive layers is greater than a thickness of each of the plurality of gate wiring lines.

Item 9

The liquid crystal display device according to any one of Items 4 to 8, in which a width of each of the plurality of base conductive layers is less than or equal to a width of each of the plurality of source wiring lines.

Item 10

The liquid crystal display device according to any one of Items 1 to 3, in which the the active matrix substrate further includes a plurality of transparent insulating layers provided above or below the interlayer insulating layer and overlapping the plurality of second ridges when viewed from the normal direction of the display surface.

Item 11

The liquid crystal display device according to Item 10, in which the plurality of transparent insulating layers are provided above the interlayer insulating layer.

Item 12

The liquid crystal display device according to Item 10 or 11, in which the plurality of transparent insulating layers are not formed in the intersecting region.

Item 13

The liquid crystal display device according to any one of Items 1 to 12, in which the active matrix substrate further includes a light blocking layer overlapping a channel region of the oxide semiconductor layer when viewed from the normal direction of the display surface.

Item 14

The liquid crystal display device according to Item 13, in which the active matrix substrate further includes a lower insulating layer covering the light blocking layer, and the plurality of source wiring lines and the oxide semiconductor layer are provided on the lower insulating layer.

Item 15

The liquid crystal display device according to any one of Items 1 to 12, further including a lower insulating layer covering the plurality of source wiring lines, in which the oxide semiconductor layer is provided on the lower insulating layer.

Item 16

The liquid crystal display device according to Item 15, in which the active matrix substrate further includes a light blocking layer overlapping a channel region of the oxide semiconductor layer when viewed from the normal direction of the display surface, and the light blocking layer is formed of the same conductive film as the plurality of source wiring lines.

Item 17

The liquid crystal display device according to any one of Items 1 to 16, in which the oxide semiconductor TFT includes a source electrode electrically connected to the oxide semiconductor layer, and the source electrode is integrally formed with any one of the plurality of source wiring lines.

Item 18

The liquid crystal display device according to any one of Items 1 to 17, in which the oxide semiconductor layer includes an In—Ga—Zn—O based semiconductor.

Item 19

The liquid crystal display device according to item 18, wherein the In—Ga—Zn—O based semiconductor includes a crystalline portion.

According to an embodiment of the present invention, it is possible to suppress the occurrence of scratches in an alignment film caused by a columnar spacer in a liquid crystal display device provided with an active matrix substrate having a lower source structure including a top gate type oxide semiconductor TFT.

DESCRIPTION OF EMBODIMENTS

Figure 1:
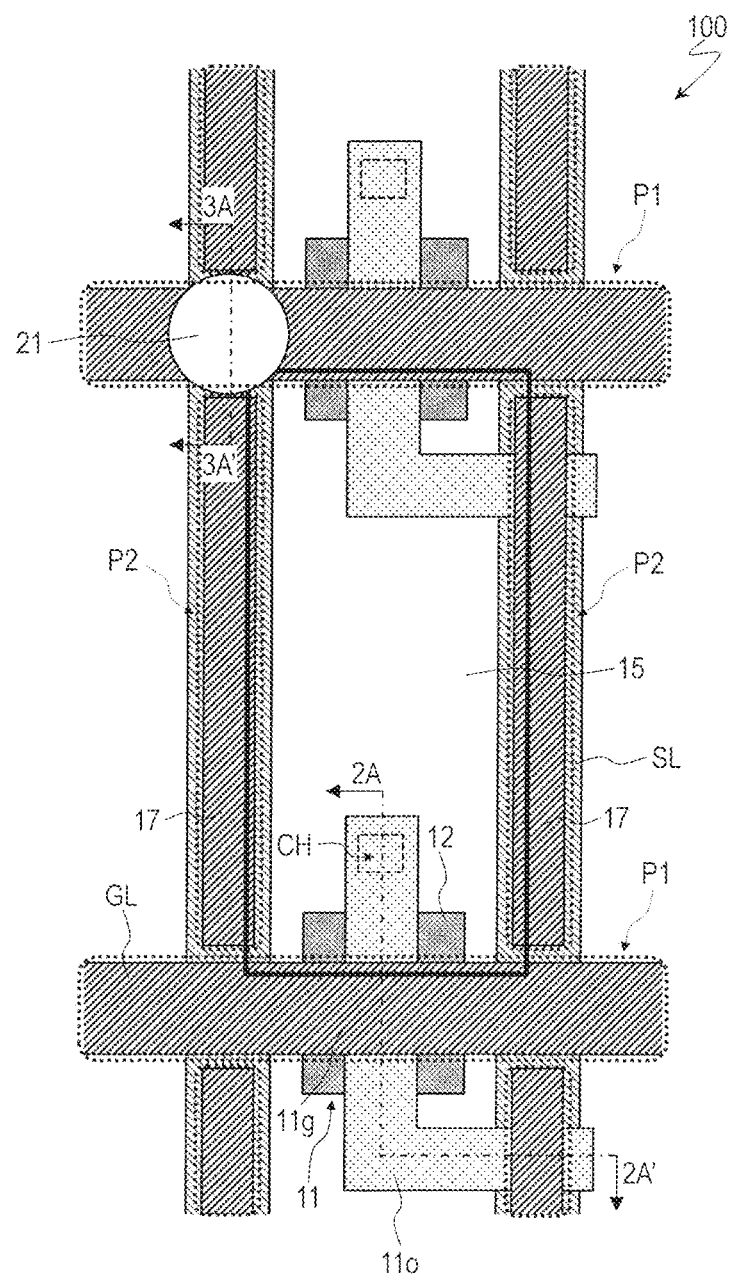
FIG. 1 is a plan view schematically illustrating a liquid crystal display device 100 according to an embodiment of the present invention and illustrates a region corresponding to one pixel of the liquid crystal display device 100.

Hereinafter, embodiments of the present invention will be described with reference to the accompanying drawings. In the drawings referenced below, components having substantially the same function may be denoted by common reference symbols and descriptions thereof may be omitted. Furthermore, for ease of explanation, configurations are simplified or schematically illustrated and some components are omitted in the drawings referenced below. The dimensional ratio between the components illustrated in each drawing is not necessarily indicative of the actual dimensional ratio.

First Embodiment

Figure 2:
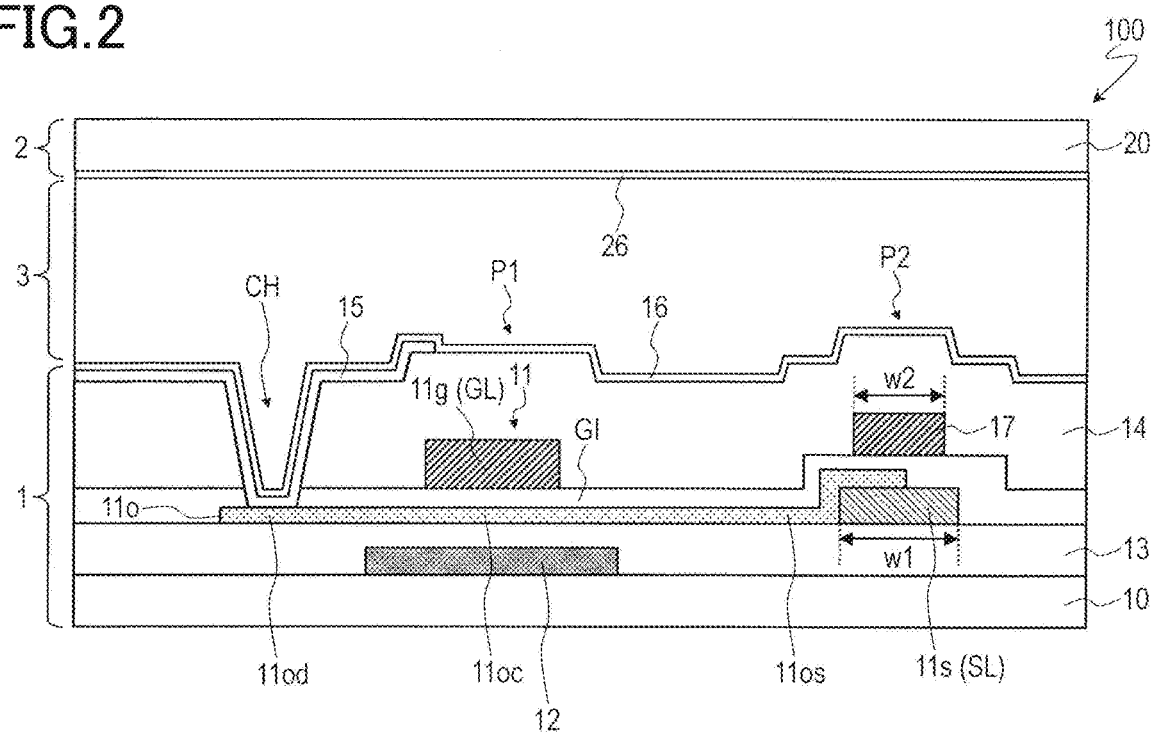
FIG. 2 is a cross-sectional view schematically illustrating the liquid crystal display device 100 and illustrates a cross section along the line 2A-2A' in FIG. 1.
Figure 3:
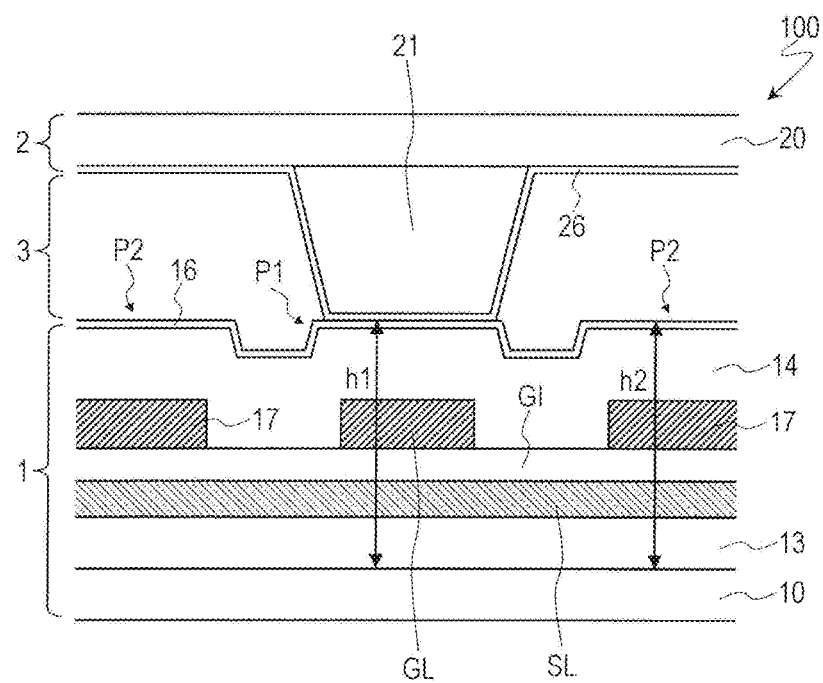
FIG. 3 is a cross-sectional view schematically illustrating the liquid crystal display device 100 and illustrates a cross section along the line 3A-3A' in FIG. 1.

A liquid crystal display device 100 according to the present embodiment will be described with reference to FIGS. 1 to 3. FIG. 1 is a plan view schematically illustrating the liquid crystal display device 100 and illustrates a region corresponding to one pixel in the liquid crystal display device 100. FIG. 2 and FIG. 3 are cross-sectional views schematically illustrating the liquid crystal display device 100 and illustrate cross sections along the lines 2A-2A' and 3A-3A' in FIG. 1, respectively.

As illustrated in FIG. 2 to FIG. 3, the liquid crystal display device 100 includes an active matrix substrate 1, a counter substrate 2 facing the active matrix substrate 1, and a liquid crystal layer 3 provided between the active matrix substrate 1 and the counter substrate 2. In addition, the liquid crystal display device 100 includes a plurality of pixels. The plurality of pixels are arranged in a matrix shape including a plurality of rows and a plurality of columns. Although not illustrated here, the liquid crystal display device 100 is typically further provided with a backlight (illumination device) disposed on a back face side (opposite to a viewer) of the active matrix substrate 1.

As illustrated in FIG. 1 and FIG. 2, the active matrix substrate 1 includes a first substrate 10 and an oxide semiconductor thin film transistor (TFT) 11 supported by the first substrate 10 and disposed in each pixel. Further, the active matrix substrate 1 includes a plurality of gate wiring lines GL extending in a row direction and a plurality of source wiring lines SL extending in a column direction.

The first substrate 10 is transparent and has insulating properties. The first substrate 10 is, for example, a glass substrate or a plastic substrate.

The oxide semiconductor TFT 11 includes an oxide semiconductor layer 11o, a gate insulating layer GI provided on the oxide semiconductor layer 11o, a gate electrode 11g facing the oxide semiconductor layer 11o with the gate insulating layer GI interposed therebetween, and a source electrode 11s electrically connected to the oxide semiconductor layer 11o.

The oxide semiconductor layer 11o includes a channel region 11oc, and a source region 11os and a drain region 11od that are positioned respectively on both sides of the channel region 11oc. When viewed in a normal direction of a display surface, the channel region 11oc overlaps the gate electrode 11g.

A light blocking layer 12 is provided below the channel region 11oc. The light blocking layer 12 overlaps at least the channel region 11oc when viewed from the normal direction of the display surface. The light blocking layer 12 is formed of, for example, a metal material.

A lower insulating layer 13 is provided covering the light blocking layer 12. The oxide semiconductor layer 11o is provided on the lower insulating layer 13. As the lower insulating layer 13, a silicon oxide ($SiO_2$) layer or a silicon nitride (SiNx) layer can be used, for example. Further, the lower insulating layer 13 may have a layered structure. For example, a silicon nitride layer may be included as a lower layer and a silicon oxide layer may be included as an upper layer. In a case where an oxide layer such as a silicon oxide layer is used as the lower insulating layer 13 (or, the top layer of the lower insulating layer 13 in a case where the lower insulating layer 13 has a layered structure), oxidation defects occurring in the channel region 11oc of the oxide semiconductor layer 11o can be reduced by the oxide film, and thus lowering of the resistance of the channel region can be suppressed.

The source electrode 11s is provided on the lower insulating layer 13. The source electrode 11s is electrically connected to the source region 11os of the oxide semiconductor layer 11o. In the illustrated example, a portion of a lower face of the source region 11os and an upper face of the source electrode 11s come into contact with each other, thereby electrically connecting the source region 11os and the source electrode 11s.

As the gate insulating layer GI, the insulating layer illustrated as a specific example of the lower insulating layer 13 can be used. In a case where an oxide layer such as a silicon oxide layer is used as the gate insulating layer GI (or, the bottom layer of the gate insulating layer GI in a case where the gate insulating layer GI has a layered structure), oxidation defects produced in the channel region 11oc can be reduced by the oxide film.

The plurality of gate wiring lines GL are formed of the same conductive film (gate metal film) as the gate electrode 11g. In the illustrated example, the gate electrode 11g is integrally formed with any one of the plurality of gate wiring lines GL, and a portion of each gate wiring line GL overlapping the oxide semiconductor layer 11o functions as the gate electrode 11g.

The plurality of source wiring lines SL are positioned closer to the first substrate 10 than the plurality of gate wiring lines GL. Specifically, the plurality of source wiring lines SL are provided on the lower insulating layer 13. More specifically, the plurality of source wiring lines SL are provided between the lower insulating layer 13 and the gate insulating layer GI. In the illustrated example, the source electrode 11s is integrally formed with any one of the plurality of source wiring lines SL, and a portion of each source wiring line SL overlapping (coming into contact with) the oxide semiconductor layer 11o functions as the source electrode 11s.

An interlayer insulating layer 14 is provided covering the plurality of gate wiring lines GL and the oxide semiconductor TFT 11. The interlayer insulating layer 14 is, for example, an organic insulating layer, but may also be an inorganic insulating layer. As a material for the organic insulating layer, a photosensitive resin material is used, for example.

A pixel electrode 15 is provided on the interlayer insulating layer 14. The pixel electrode 15 is formed of a transparent conductive material (indium tin oxide (ITO), for example). The pixel electrode 15 is electrically connected to the drain region 11od of the oxide semiconductor layer 11o. In the illustrated example, the pixel electrode 15 is in contact with the drain region 11od in a contact hole CH formed in the gate insulating layer GI and the interlayer insulating layer 14. That is, the pixel electrode 15 is directly connected to the drain region 11od without a drain electrode formed of a metal material interposed therebetween. Slits and openings may be formed in the pixel electrode 15 in accordance with the display mode used.

A first alignment film 16 is provided on an outermost surface of the active matrix substrate 1 and comes into contact with the liquid crystal layer 3. As the first alignment film 16, a horizontal alignment film or a vertical alignment film is used in accordance with the display mode.

The counter substrate 2 includes a second substrate 20 and a plurality of columnar spacers 21 provided on the second substrate 20. In addition, although not illustrated here, the counter substrate 2 typically further includes a color filter and a black matrix.

The second substrate 20 is transparent and has insulating properties. The second substrate 20 is, for example, a glass substrate or a plastic substrate.

The plurality of columnar spacers 21 define the thickness (cell gap) of the liquid crystal layer 3. The plurality of columnar spacers 21 are typically formed of a photosensitive resin material and may be referred to as "photo spacers".

A second alignment film 26 is provided on an outermost surface of the counter substrate 2 and comes into contact with the liquid crystal layer 3. As the second alignment film 26, a horizontal alignment film or a vertical alignment film is used in accordance with the display mode.

Note that, although not illustrated here, one of the active matrix substrate 1 and the counter substrate 2 further includes a common electrode to which a common voltage is applied. For example, in the case of a display mode utilizing a vertical electric field, a common electrode is provided to the counter substrate 2, and in the case of a display mode utilizing a transverse electric field, a common electrode is provided to the active matrix substrate 1.

Further, although not illustrated here, the liquid crystal display device 100 includes a pair of polarizers that face each other with at least the liquid crystal layer 3 interposed therebetween. For example, one of the pair of polarizers is disposed on the back face side of the active matrix substrate 1, and the other is disposed on a front face side of the counter substrate 2.

As illustrated in FIG. 1 and FIG. 3, each of the plurality of columnar spacers 21 is disposed in a region (hereinafter referred to as an "intersecting region") where any one of the plurality of gate wiring lines GL and any one of the plurality of source wiring lines SL intersect. Note that the columnar spacers 21 need not be disposed in all of the plurality of intersecting regions. The arrangement density of each columnar spacer 21 is set as appropriate according to specifications and applications of the liquid crystal display device 100.

As illustrated in FIGS. 1 to 3, a front face of the active matrix substrate 1 on the liquid crystal layer 3 side includes a plurality of first ridges P1 overlapping the plurality of gate wiring lines GL when viewed from the normal direction of the display surface, and a plurality of second ridges P2 overlapping the plurality of source wiring lines SL when viewed from the normal direction of the display surface.

The first ridge P1 is a portion raised above the other portions (portions other than the first ridge P1 and the second ridge P2) due to the thickness of the gate wiring line GL. In a lower source structure, the gate wiring line GL is positioned on the upper layer side of the source wiring line SL, and thus the shape of the gate wiring line GL is readily reflected in the front face of the active matrix substrate 1 on the liquid crystal layer 3 side.

As illustrated in FIGS. 1 to 3, the active matrix substrate 1 includes a plurality of base conductive layers 17 provided below the interlayer insulating layer 14. The plurality of base conductive layers 17 overlap the plurality of second ridges P2 when viewed from the normal direction of the display surface. The second ridge P2 is a portion raised above the other portions (portions other than the first ridge P1 and the second ridge P2) due to the thickness of the base conductive layer 17.

In the illustrated example, the plurality of base conductive layers 17 are formed of the same conductive film (that is, a gate metal film) as the plurality of gate wiring lines GL. Accordingly, the thickness of the base conductive layer 17 and the thickness of the gate wiring line GL are substantially the same. The thicknesses of the base conductive layer 17 and the gate wiring line GL are, for example, greater than or equal to 100 nm and less than or equal to 500 nm. Further, the plurality of base conductive layers 17 are not electrically connected to the plurality of gate wiring lines GL, and are electrically floating.

In the liquid crystal display device 100 according to the present embodiment, providing the first ridges P1 and the second ridges P2 such as described above makes it possible to prevent the occurrence of scratches in the alignment film 16 caused by the columnar spacers (photo spacers) 21.

Figure 4:
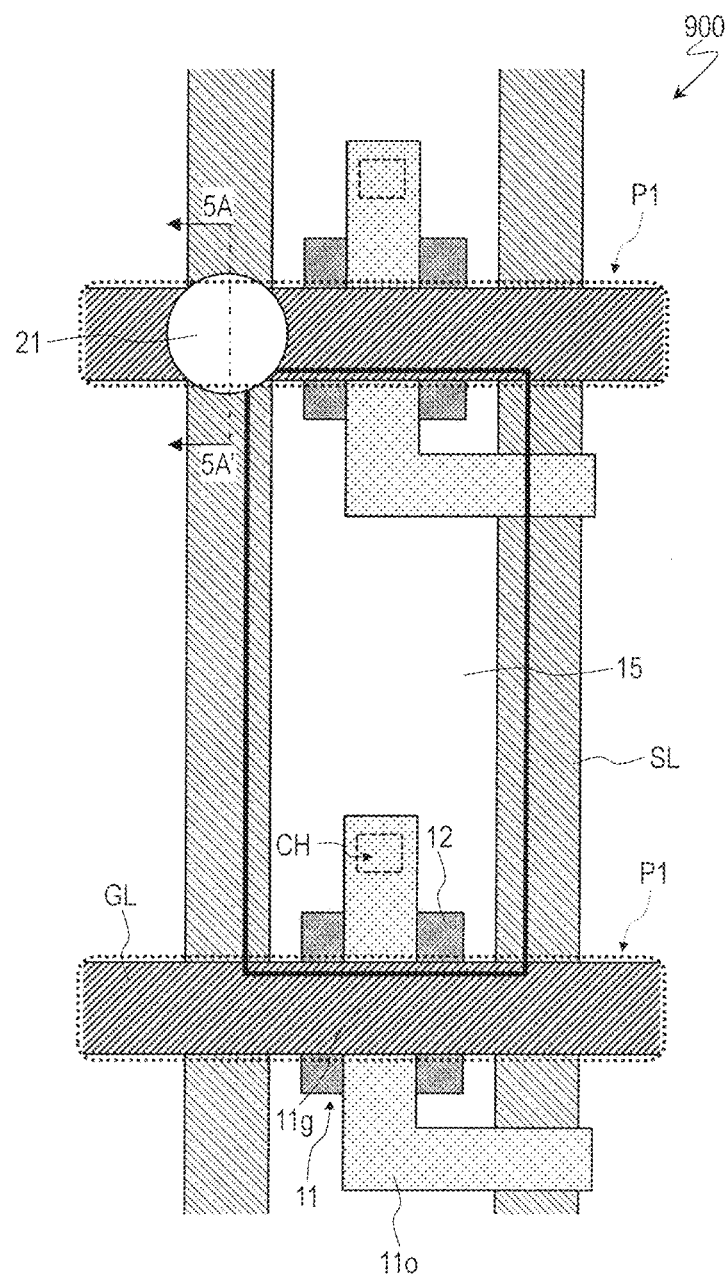
FIG. 4 is a plan view schematically illustrating a liquid crystal display device 900 of a comparative example and illustrates a region corresponding to one pixel in the liquid crystal display device 900.
Figure 5:
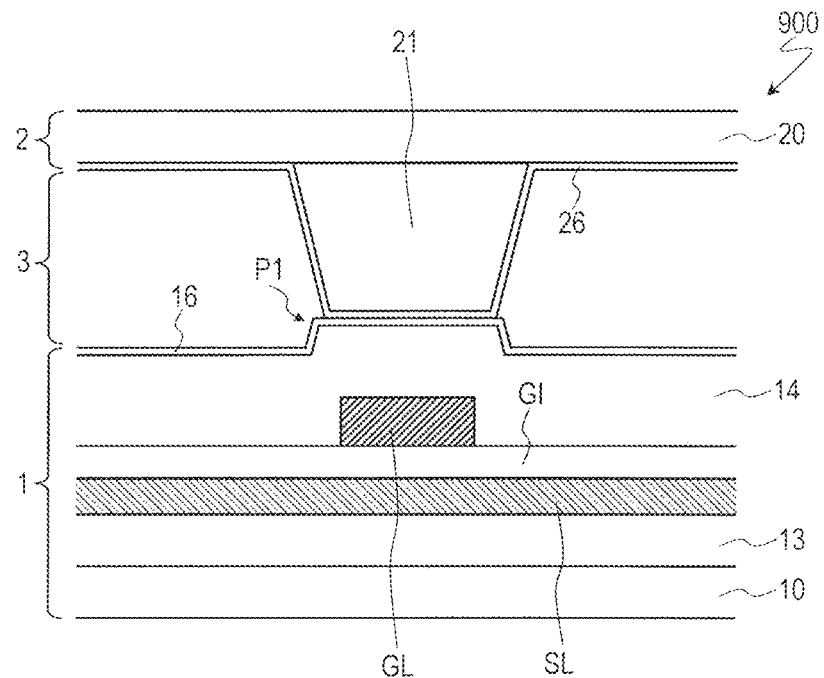
FIG. 5 is a cross-sectional view schematically illustrating the liquid crystal display device 900 and illustrates a cross section along the line 5A-5A' in FIG. 4.

Hereinafter, the reason for this is described with reference to the structure of a liquid crystal display device 900 of a comparative example illustrated in FIG. 4 and FIG. 5. FIG. 4 is a plan view schematically illustrating the liquid crystal display device 900 and illustrates a region corresponding to one pixel in the liquid crystal display device 900. FIG. 5 is a cross-sectional view schematically illustrating the liquid crystal display device 900 and illustrates a cross section along the line 5A-5A' in FIG. 4.

As illustrated in FIG. 4 and FIG. 5, the active matrix substrate 1 of the liquid crystal display device 900 of the comparative example has a lower source structure. That is, the source wiring line SL is positioned closer to the first substrate 10 than the gate wiring line GL. In other words, the gate wiring line GL is positioned on the upper layer side of the source wiring line SL. Therefore, the front face of the active matrix substrate 1 on the liquid crystal layer 3 side includes the plurality of first ridges P1 raised due to the thickness of the plurality of gate wiring lines GL. Needless to say, the plurality of first ridges P1 overlap the plurality of gate wiring lines GL when viewed from the normal direction of the display surface.

However, in the liquid crystal display device 900 of the comparative example, unlike the liquid crystal display device 100 of the present embodiment, the base conductive layer 17 is not provided below the interlayer insulating layer 14. Therefore, the front face of the active matrix substrate 1 of the liquid crystal display device 900 on the liquid crystal layer 3 side does not include the second ridges P2 (raised portions due to the thickness of the base conductive layer 17).

In the liquid crystal display device 900 of the comparative example as well, each of the plurality of columnar spacers 21 is disposed in the intersecting region (the region where the gate wiring line GL and the source wiring line SL intersect).

Figure 6:
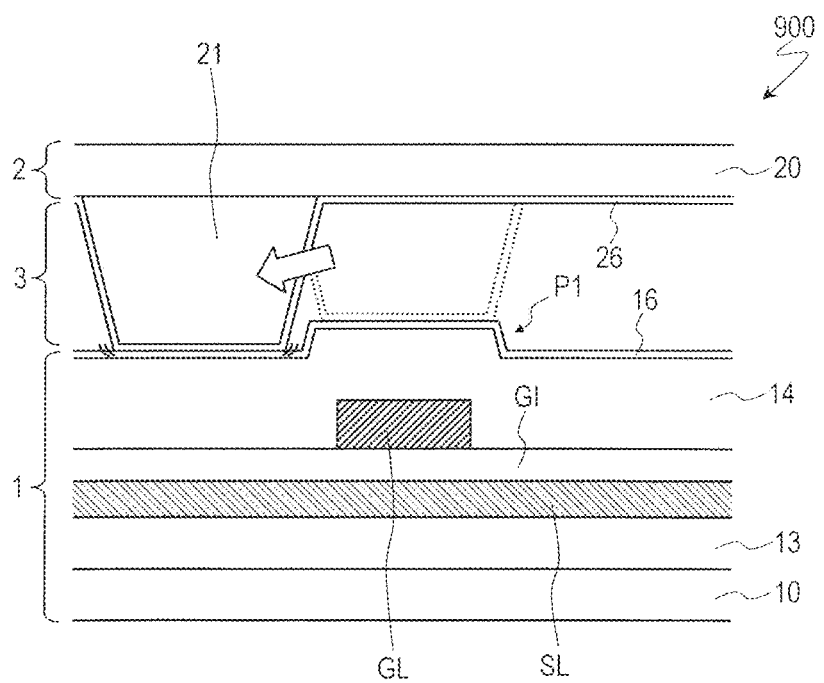
FIG. 6 is a drawing illustrating a state in the liquid crystal display device 900 in which a position of a columnar spacer 21 is offset due to externally applied stress.

In the liquid crystal display device 900 of the comparative example, as illustrated in FIG. 6, the position of the columnar spacer 21 may be offset due to externally applied stress. Due to such a positional offset, when the columnar spacer 21 deviates from the intersecting region, that is, when the columnar spacer 21 falls to a position offset from the first ridge P1, there is a risk that scratches caused by the columnar spacer 21 may occur in the alignment film 16 in a region that contributes to the display. Scratches are visible as brush-like marks at the time of black display.

Figure 7:
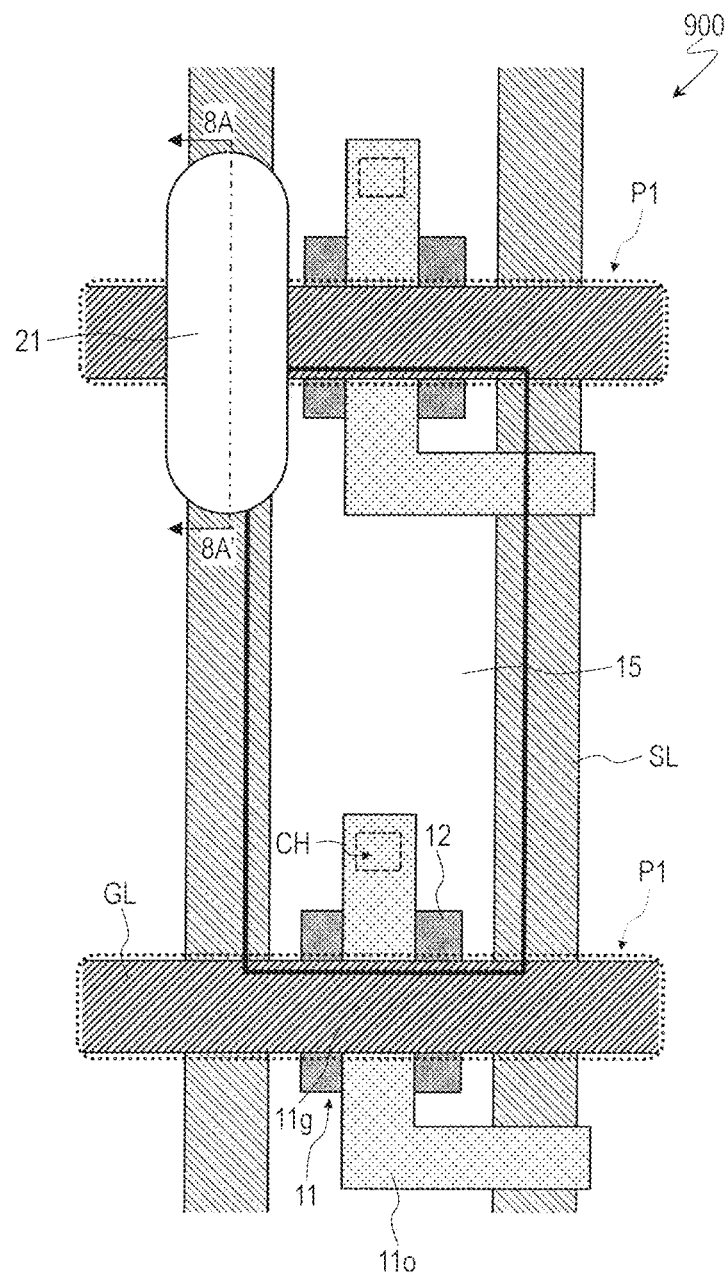
FIG. 7 is a plan view illustrating a configuration in which the columnar spacer 21 of the liquid crystal display device 900 is widened in a column direction.
Figure 8:
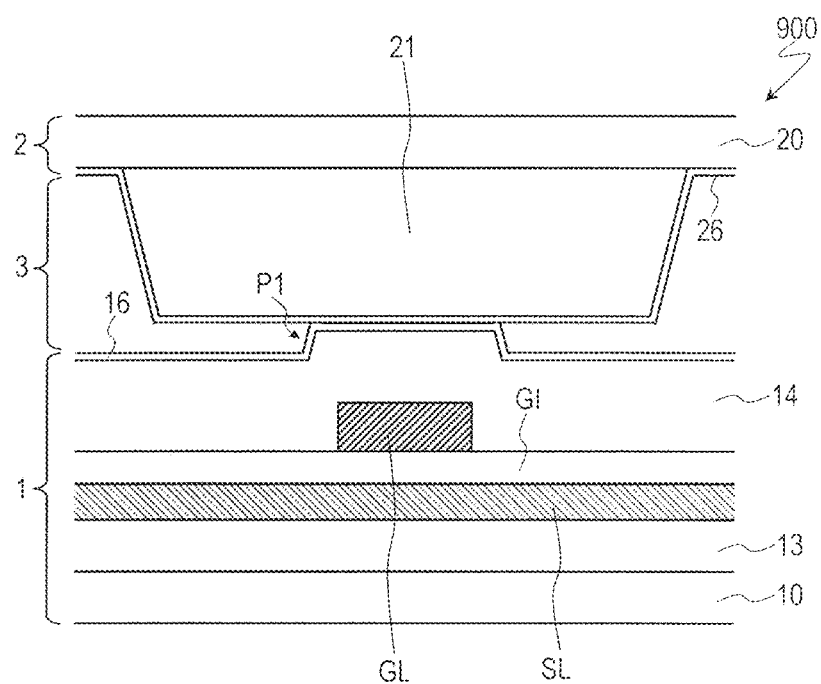
FIG. 8 is a cross-sectional view schematically illustrating a configuration in which the columnar spacer 21 of the liquid crystal display device 900 is widened in the column direction and illustrates a cross section along a line 8A-8A' in FIG. 7.

As a technique for preventing the occurrence of scratching by the columnar spacer 21, it is conceivable to widen the columnar spacers 21 in the column direction (that is, in a direction orthogonal to the direction in which the first ridge P1 extends), as illustrated in FIG. 7 and FIG. 8. Nevertheless, widening the columnar spacers 21 in the column direction causes a significant decrease in aperture ratio. This is because, in the vicinity of the columnar spacer 21, the alignment of the liquid crystal molecules is disturbed, and thus the columnar spacer 21 and the periphery thereof are blocked by a black matrix provided to the counter substrate 2. A reduction in the aperture ratio such as described above is particularly significant in a case where the resolution of the liquid crystal display device 900 is high.

Figure 9:
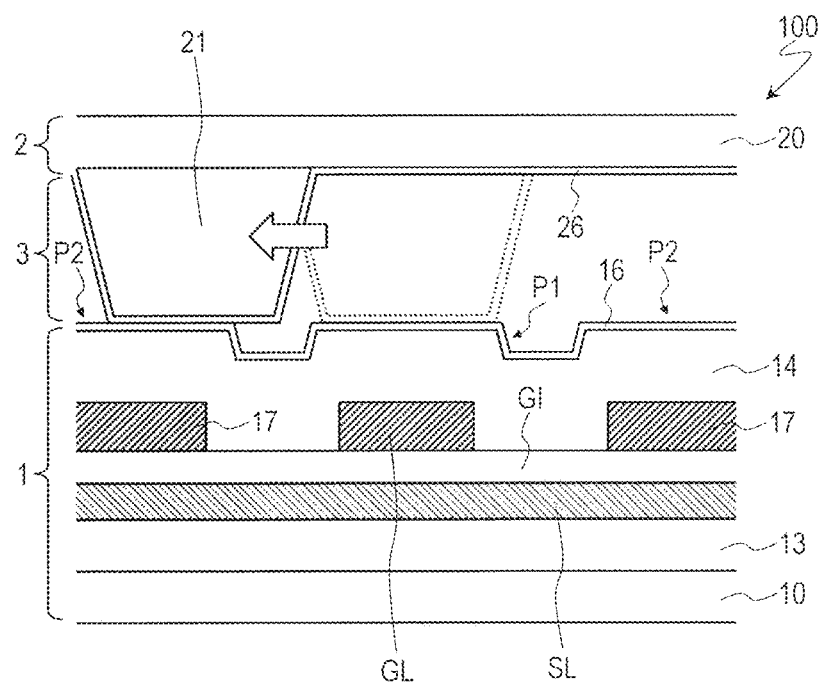
FIG. 9 is a drawing illustrating a state in the liquid crystal display device 100 in which the position of the columnar spacer 21 is offset due to externally applied stress.

In contrast, in the liquid crystal display device 100 of the present embodiment, the front face of the active matrix substrate 1 on the liquid crystal layer 3 side includes, in addition to the plurality of first ridges P1, the plurality of second ridges P2 overlapping the plurality of source wiring lines SL when viewed from the normal direction of the display surface. This makes it possible to prevent the columnar spacer 21 from falling even in a case where the position of the columnar spacer 21 is offset, as illustrated in FIG. 9. Therefore, it is possible to suppress the occurrence of scratches caused by the columnar spacer 21 in the alignment film 16 in a region contributing to the display.

As described above, according to the embodiment of the present invention, in the liquid crystal display device 100 provided with the active matrix substrate 1 having the lower source structure, the occurrence of scratches in the alignment film 16 caused by the columnar spacer 21 can be suppressed without causing a decrease in the aperture ratio. Further, the degree of freedom in shape and dimension of the columnar spacer 21 is increased. A cross-sectional shape of the columnar spacer 21 (the shape in a cross section parallel to the first substrate 10) may be any of various shapes, such as a perfect circle, a square, or the like.

A height h2 (refer to FIG. 3) of each of the plurality of second ridges P2 is preferably greater than or equal to a height h1 (refer to FIG. 3) of each of the plurality of first ridges P1. Here, the height h1 of the first ridge P1 and the height h2 of the second ridge P2 are each a distance from a planar face (here, a front face of the first substrate 10) serving as a reference to a peak face of the first ridge P1 or the second ridge P2. From the perspective of more reliably preventing the columnar spacer 21 from falling, the height h2 of each of the plurality of second ridges P2 is preferably greater than the height h1 of each of the plurality of first ridges P1, and more preferably greater than or equal to 20 nm.

As illustrated in the present embodiment, forming the plurality of base conductive layers 17 of the same conductive film as the plurality of gate wiring lines GL creates the advantage that it is not necessary to add a step of forming the base conductive layer 17 when manufacturing the liquid crystal display device 100.

In the present embodiment, a configuration is illustrated in which the plurality of base conductive layers 17 are not electrically connected to the plurality of gate wiring lines GL. However, each of the base conductive layers 17 may be electrically connected to any one of the plurality of gate wiring lines GL. However, from the perspective of reducing parasitic capacitance and preventing a decrease in yield, the plurality of base conductive layers 17 are preferably not electrically connected to the plurality of gate wiring lines GL.

From the perspective of preventing reduction in the aperture ratio, a width w2 (refer to FIG. 2) of each of the plurality of base conductive layers 17 is preferably less than or equal to a width w1 (refer to FIG. 2) of each of the plurality of source wiring lines SL. When the width w2 of the base conductive layer 17 is greater than the width w1 of the source wiring line SL, the aperture ratio may decrease. However, when the width w2 of the base conductive layer 17 is too small, the second ridge P2 may not be appropriately formed with a sufficient width. Thus, the width w2 of the base conductive layer 17 is preferably smaller than the width w1 of the source wiring line SL by an amount greater than or equal to 0 μm and less than or equal to 1 μm.

Second Embodiment

Figure 10:
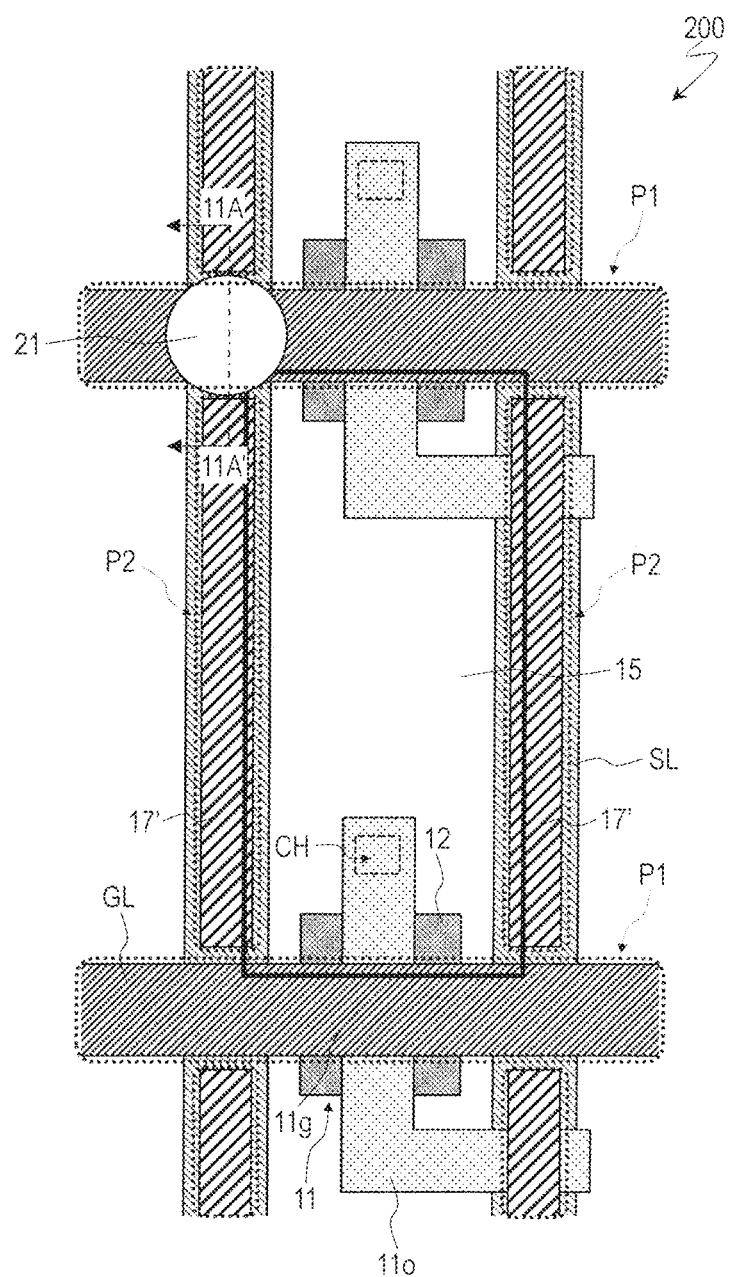
FIG. 10 is a plan view schematically illustrating another liquid crystal display device 200 according to an embodiment of the present invention and illustrates a region corresponding to one pixel of the liquid crystal display device 200.
Figure 11:
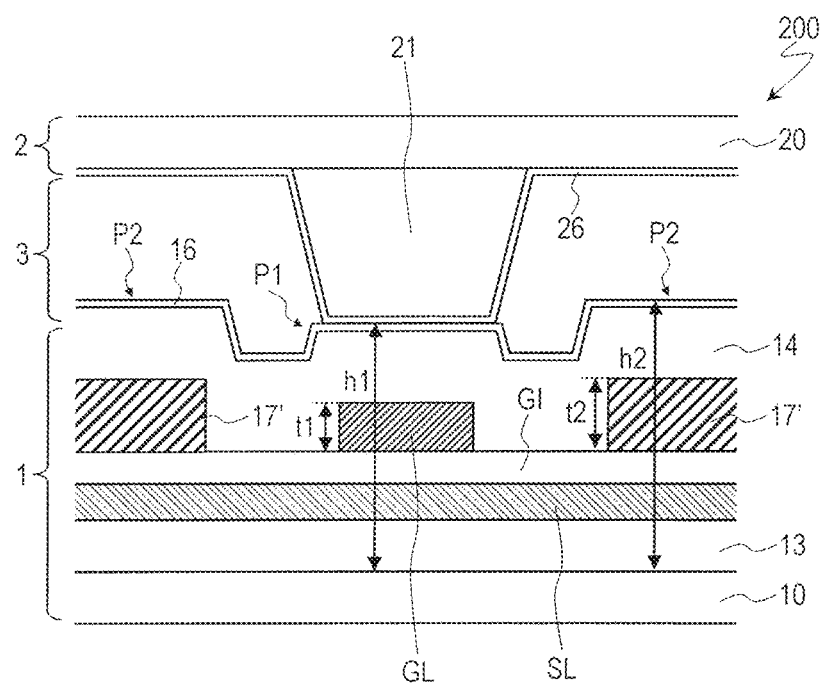
FIG. 11 is a cross-sectional view schematically illustrating the liquid crystal display device 200 and illustrates a cross section along the line 11A-11A' in FIG. 10.

A liquid crystal display device 200 of the present embodiment will be described with reference to FIG. 10 and FIG. 11. FIG. 10 is a plan view schematically illustrating the liquid crystal display device 200 and illustrates a region corresponding to one pixel in the liquid crystal display device 200. FIG. 11 is a cross-sectional view schematically illustrating the liquid crystal display device 200 and illustrates a cross section along the line 11A-11A' in FIG. 10. The following description will focus on differences between the liquid crystal display device 200 and the liquid crystal display device 100 of the first embodiment.

The liquid crystal display device 200 of the present embodiment differs from the liquid crystal display device 100 of the first embodiment in that a plurality of base conductive layers 17' are formed of a conductive film different from that of the plurality of gate wiring lines GL. Further, in the illustrated example, a thickness t2 of the base conductive layer 17' is greater than a thickness t1 of the gate wiring line GL, and the height h2 of the second ridge P2 is greater than the height h1 of the first ridge P1.

In the present embodiment, because the base conductive layer 17' is formed of a conductive film different from that of the gate wiring line GL, the thickness t2 of the base conductive layer 17' can be set independently of (that is, different from) the thickness t1 of the gate wiring line GL. Accordingly, it is easier to control the height h2 of the second ridge P2. Therefore, it is easier to realize a configuration in which the height h2 of the second ridge P2 is greater than the height h1 of the first ridge P1. With the height h2 of the second ridge P2 greater than the height h1 of the first ridge P1, it is possible prevent a positional offset of the columnar spacer 21.

The height h2 of the second ridge P2 can be made greater than the height h1 of the first ridge P1 by making the thickness t2 of the base conductive layer 17' greater than the thickness t1 of the gate wiring line GL. From the perspective of more reliably achieving a configuration in which the height h2 of the second ridge P2 is greater than the height h1 of the first ridge P1, the thickness t2 of the base conductive layer 17' is preferably made greater than the thickness t1 of the gate wiring line GL by 50 nm or more.

The conductive material that forms the base conductive layer 17' is not particularly limited, and various metal materials can be used.

Third Embodiment

Figure 12:
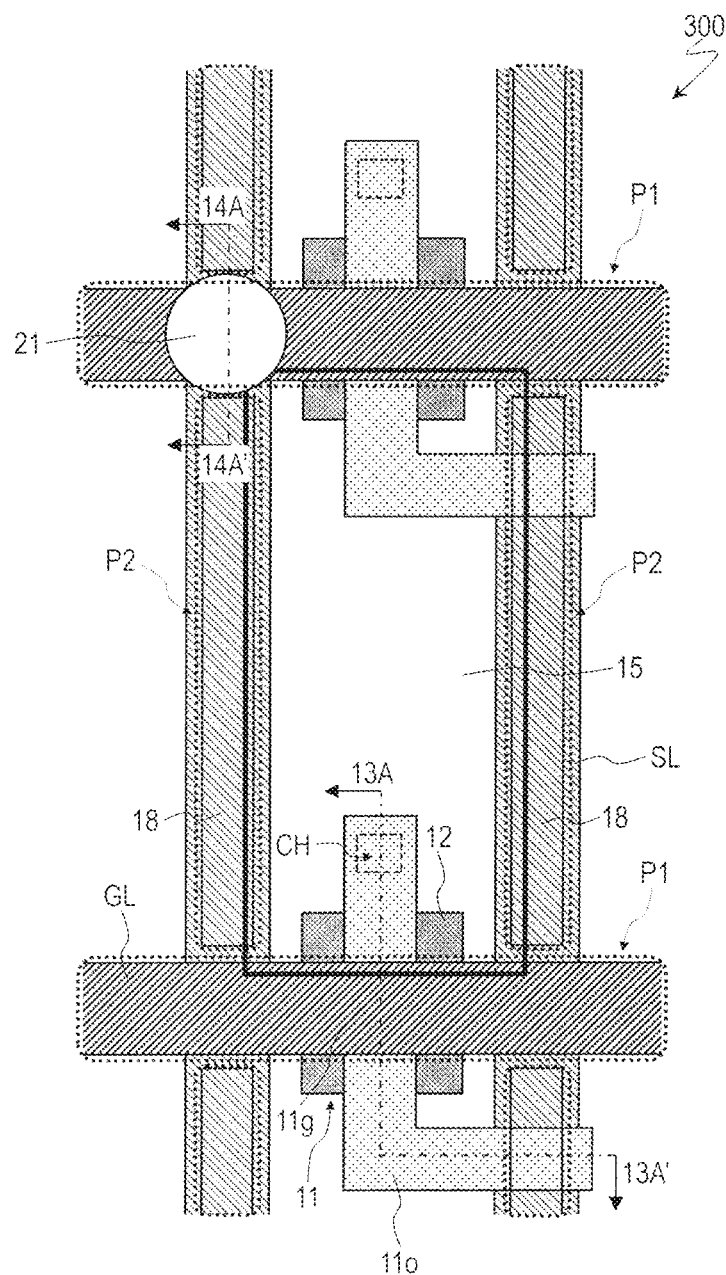
FIG. 12 is a plan view schematically illustrating yet another liquid crystal display device 300 according to an embodiment of the present invention and illustrates a region corresponding to one pixel of the liquid crystal display device 300.
Figure 13:
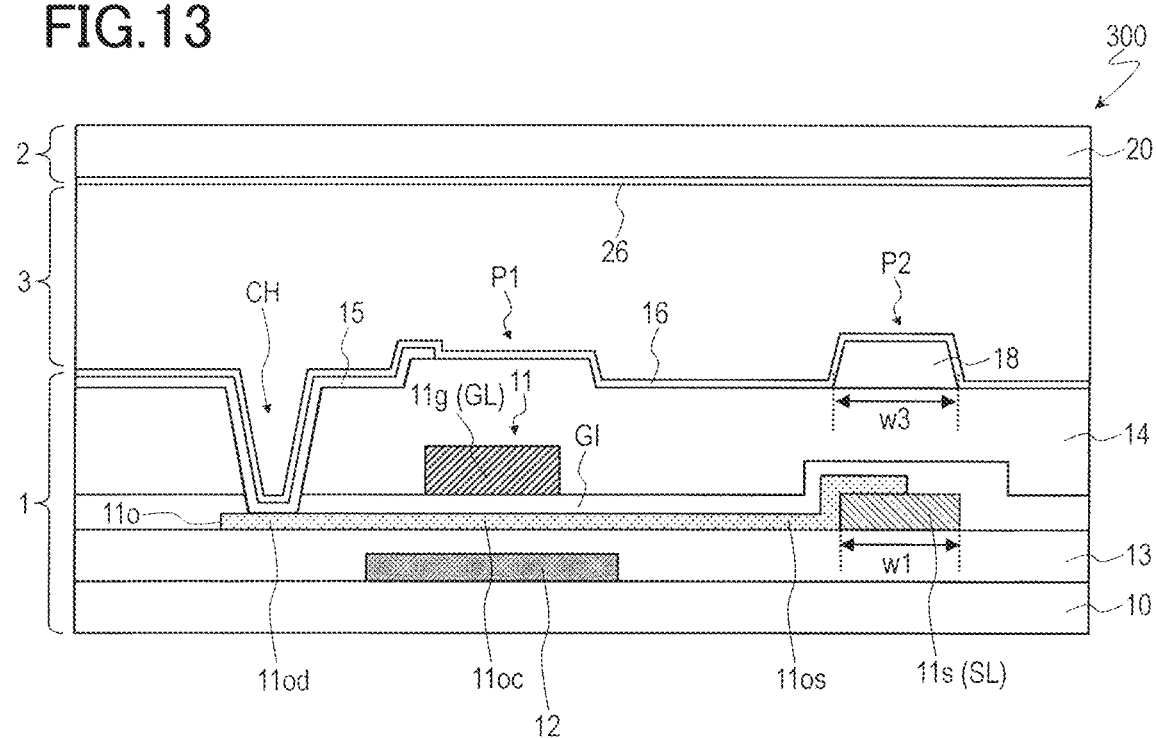
FIG. 13 is a cross-sectional view schematically illustrating the liquid crystal display device 300 and illustrates a cross section along the line 13A-13A' in FIG. 12.
Figure 14:
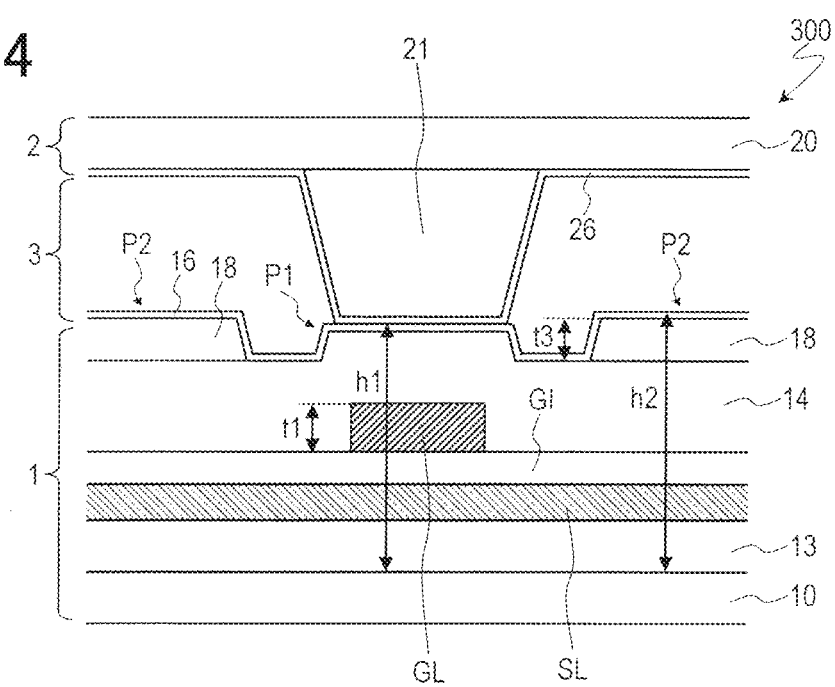
FIG. 14 is a cross-sectional view schematically illustrating the liquid crystal display device 300 and illustrates a cross section along the line 14A-14A' in FIG. 12.

A liquid crystal display device 300 of the present embodiment will be described with reference to FIGS. 12 to 14. FIG. 12 is a plan view schematically illustrating the liquid crystal display device 300 and illustrates a region corresponding to one pixel in the liquid crystal display device 300. FIG. 13 and FIG. 14 are cross-sectional views schematically illustrating the liquid crystal display device 300 and illustrate cross sections along the lines 13A-13A' and 14A-14A' in FIG. 12, respectively. The following description will focus on differences between the liquid crystal display device 300 and the liquid crystal display device 100 of the first embodiment.

The active matrix substrate 1 of the liquid crystal display device 300 in the present embodiment is different from those of the liquid crystal display devices 100, 200 of the first and second embodiments, and does not include the base conductive layer 17, 17'. Further, the active matrix substrate 1 of the liquid crystal display device 300 includes a plurality of transparent insulating layers 18 provided above the interlayer insulating layer 14. The plurality of transparent insulating layers 18 overlap the plurality of second ridges P2 when viewed from the normal direction of the display surface. Each second ridge P2 is raised above the other portions (portions other than the first ridge P1 and the second ridge P2) due to the thickness of the transparent insulating layer 18. In the example illustrated, the transparent insulating layer 18 is not formed in the intersecting region (the region where any one of the plurality of gate wiring lines GL and any one of the plurality of source wiring lines SL intersect).

In the present embodiment, the second ridge P2 is formed by the transparent insulating layer 18 provided above the interlayer insulating layer 14, and thus the aperture ratio does not decrease even when a width w3 of the transparent insulating layer 18 is greater than the width w1 of the source wiring line SL. Further, even when the transparent insulating layer 18 overlaps the source wiring line SL, the parasitic capacitance of the source wiring line SL is not increased, and thus load of the source wiring line SL does not increase. Furthermore, the thickness t3 of the transparent insulating layer 18 can be set independently of the thickness t1 of the gate wiring line GL, making it easier to control the height h2 of the second ridge P2. Therefore, it is easier to realize a configuration in which the height h2 of the second ridge P2 is greater than the height h1 of the first ridge P1. For example, the height h2 of the second ridge P2 can be made greater than the height h1 of the first ridge P1 by making the thickness t3 of the transparent insulating layer 18 greater than the thickness t1 of the gate wiring line GL.

Note that when the transparent insulating layer 18 is formed in the intersecting region, a height of the front face of the active matrix substrate 1 on the liquid crystal layer 3 side may be highest in the intersecting region. Therefore, the transparent insulating layer 18 is preferably not formed in the intersecting region.

As the material of the transparent insulating layer 18, a photosensitive resin material can be used, for example.

The width w3 of the transparent insulating layer 18 is not particularly limited, but when the width w3 of the transparent insulating layer 18 is too small, there is a risk that the second ridge P2 cannot be suitably formed with sufficient width, and thus the width w3 [μm] of the transparent insulating layer 18 preferably satisfies the relationship w3≥w1−1 with the width w1 [μm] of the source wiring line SL.

Note that while a configuration in which the transparent insulating layer 18 is provided on the interlayer insulating layer 14 is illustrated herein, the transparent insulating layer 18 may be provided below the interlayer insulating layer 14, and more specifically, between the gate insulating layer GI and the interlayer insulating layer 14. However, a configuration in which the transparent insulating layer 18 is provided above the interlayer insulating layer 14 makes it easier to control the height h2 of the second ridge P2.

Fourth Embodiment

Figure 15:
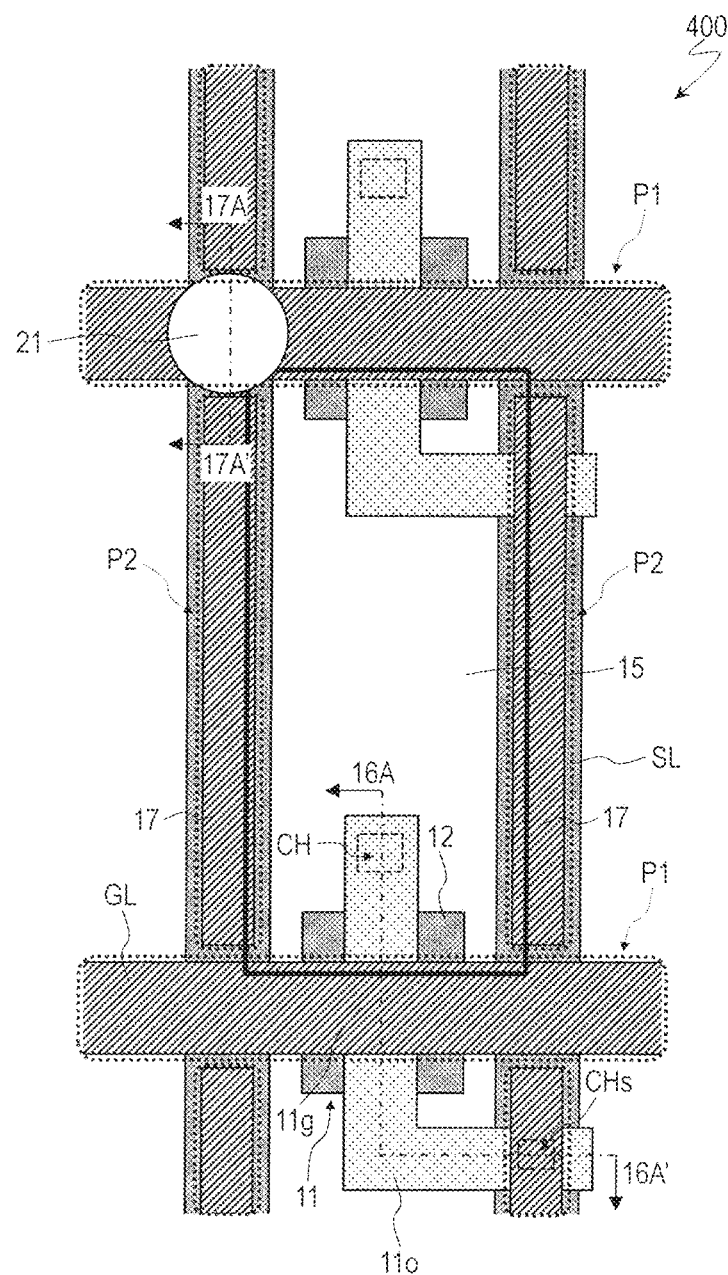
FIG. 15 is a plan view schematically illustrating yet another liquid crystal display device 400 according to an embodiment of the present invention and illustrates a region corresponding to one pixel of the liquid crystal display device 400.
Figure 16:
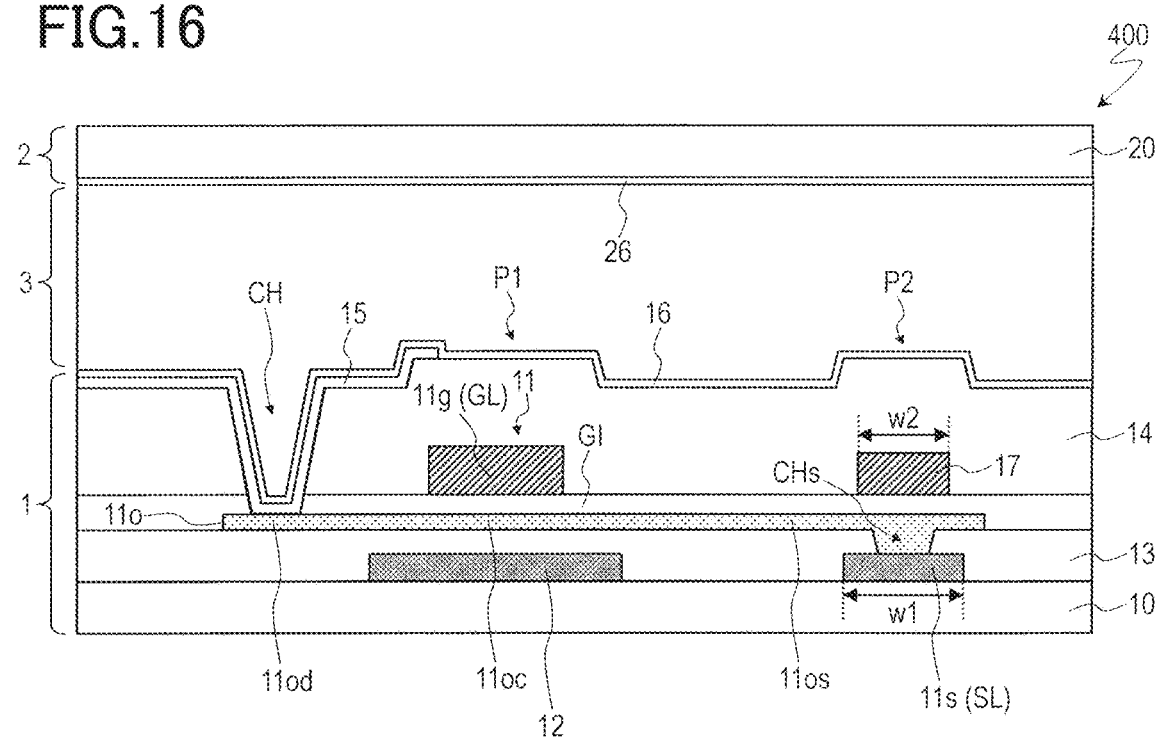
FIG. 16 is a cross-sectional view schematically illustrating the liquid crystal display device 400 and illustrates a cross section along the line 16A-16A' in FIG. 15.
Figure 17:
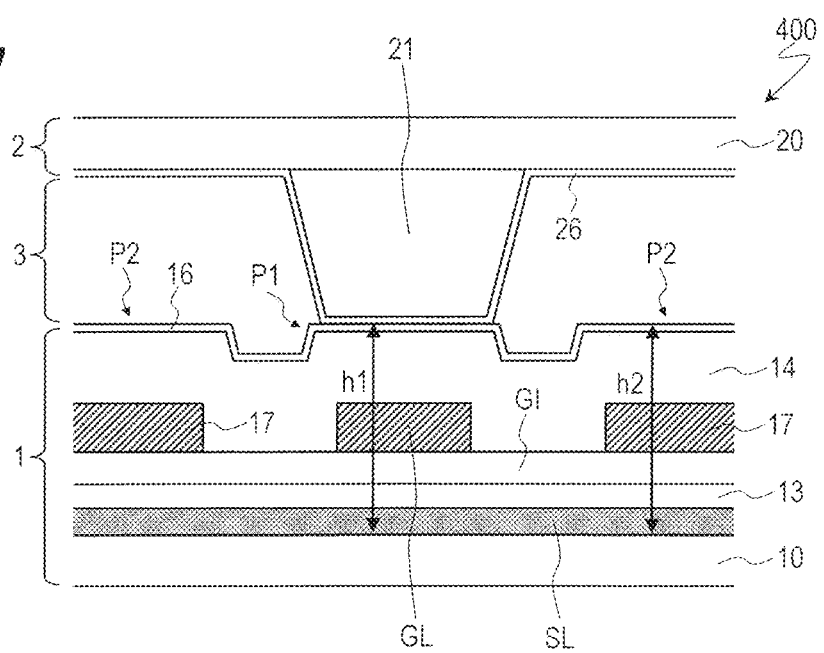
FIG. 17 is a cross-sectional view schematically illustrating the liquid crystal display device 400 and illustrates a cross section along the line 17A-17A' in FIG. 15.

A liquid crystal display device 400 according to the present embodiment will be described with reference to FIGS. 15 to 17. FIG. 15 is a plan view schematically illustrating the liquid crystal display device 400 and illustrates a region corresponding to one pixel in the liquid crystal display device 400. FIG. 16 and FIG. 17 are cross-sectional views schematically illustrating the liquid crystal display device 400 and illustrate cross sections along the lines 16A-16A' and 17A-17A' in FIG. 15, respectively. The following description will focus on differences between the liquid crystal display device 400 and the liquid crystal display device 100 of the first embodiment.

In the liquid crystal display device 100 of the first embodiment, the plurality of source wiring lines SL are provided on the lower insulating layer 13. In contrast, in the liquid crystal display device 400 of the present embodiment, the plurality of source wiring lines SL are provided below the lower insulating layer 13. In other words, the plurality of source wiring lines SL are covered by the lower insulating layer 13. Further, the light blocking layer 12 is formed of the same conductive film as the plurality of source wiring lines SL. The oxide semiconductor layer 11o is provided on the lower insulating layer 13. The source region 11os and the source electrode 11s of the oxide semiconductor layer 11o are connected in a contact hole CHs formed in the lower insulating layer 13.

As in the present embodiment, when the source wiring line SL and the light blocking layer 12 are formed of the same conductive film, the manufacturing process can be simplified compared to a configuration in which the source wiring line SL and the light blocking layer 12 are formed in different layers (that is, formed of different conductive films), as in the liquid crystal display device 100 of the first embodiment. However, when the source wiring line SL and the light blocking layer 12 are formed of the same conductive film, in order to make the source wiring line SL and the light blocking layer 12 not electrically connected to each other (not conductive), spacing between the source wiring line SL and the light blocking layer 12 needs to be greater than or equal to a predetermined size. Therefore, in a high definition liquid crystal display device, it can be said that it is preferable to adopt a configuration in which the source wiring line SL and the light blocking layer 12 are formed in different layers as in the first embodiment.

Note that, in the liquid crystal display device 400 of the present embodiment, instead of the base conductive layer 17 formed of the same conductive film as the gate wiring line GL, the base conductive layer 17' formed of a conductive film different from that of the gate wiring line GL may be provided, similar to the liquid crystal display device 200 of the second embodiment. Further, the transparent insulating layer 18 may be provided in place of the base conductive layer 17, as in the liquid crystal display device 300 of the third embodiment.

As described above, in the liquid crystal display devices 100, 200, 300, 400 of the first, second, third, and fourth embodiments, the occurrence of scratches in the alignment film 16 caused by the columnar spacer 21 can be prevented.

Note that the configuration for forming the second ridge P2 is not limited to a configuration in which the base conductive layer 17, 17' such as illustrated are provided, or a configuration in which the transparent insulating layer 18 is provided. For example, a finishing treatment may be performed. Specifically, for example, the film thickness of portions other than the second ridge P2 may be reduced to a target film thickness by, for example, forming the interlayer insulating layer 14 thicker than the target film thickness in advance and then etching with the portion corresponding to the second ridge P2 covered by a mask.

Oxide Semiconductor

The oxide semiconductor contained in the oxide semiconductor layer 11o may be an amorphous oxide semiconductor or may be a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer 11o may have a layered structure of two or more layers. When the oxide semiconductor layer 11o has a layered structure, the oxide semiconductor layer 11o may include an amorphous oxide semiconductor layer and a crystalline oxide semiconductor layer. Alternatively, the oxide semiconductor layer 11o may include a plurality of crystalline oxide semiconductor layers having different crystal structures. In addition, the oxide semiconductor layer 11o may include a plurality of amorphous oxide semiconductor layers. In a case where the oxide semiconductor layer 11o has a dual-layer structure including an upper layer and a lower layer, an energy gap of the oxide semiconductor included in the lower layer is preferably greater than an energy gap of the oxide semiconductor included in the upper layer. However, when the difference in energy gap between these layers is relatively small, the energy gap of the oxide semiconductor in the upper layer may be greater than the energy gap of the oxide semiconductor in the lower layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer 11o may include, for example, at least one metal element selected from In, Ga, and Zn. In the present embodiment, the oxide semiconductor layer 11o includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer 11o can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. A TFT including an In—Ga—Zn—O based semiconductor layer has high mobility (more than 20 times as compared to an a-Si TFT) and a low leakage current (less than 1/100th as compared to the a-Si TFT), and thus such a TFT can be used suitably as a driving TFT (for example, a TFT present in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 11o may include another oxide semiconductor. For example, the oxide semiconductor layer 11o may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer 11o may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

According to the embodiments of the present invention, it is possible to suppress the occurrence of scratches in an alignment film caused by a columnar spacer in a liquid crystal display device provided with an active matrix substrate having a lower source structure including a top gate type oxide semiconductor TFT.

The invention claimed is:

1. A liquid crystal display device including a plurality of pixels arranged in a matrix shape including a plurality of rows and a plurality of columns, the liquid crystal display device comprising:
an active matrix substrate;
a counter substrate facing the active matrix substrate; and
a liquid crystal layer provided between the active matrix substrate and the counter substrate,
wherein the active matrix substrate includes
a first substrate,
an oxide semiconductor TFT supported by the first substrate, disposed in each of the plurality of pixels, and including
an oxide semiconductor layer,
a gate insulating layer provided on the oxide semiconductor layer, and
a gate electrode facing the oxide semiconductor layer with the gate insulating layer interposed therebetween,
a plurality of gate wiring lines formed of the same conductive film as the gate electrode and extending in a row direction,
a plurality of source wiring lines extending in a column direction and positioned closer to the first substrate than to the plurality of gate wiring lines,
an interlayer insulating layer covering the plurality of gate wiring lines and the oxide semiconductor TFT, and
a first alignment film that comes into contact with the liquid crystal layer,
the counter substrate includes
a second substrate,
a columnar spacer provided on the second substrate, and
a second alignment film that comes into contact with the liquid crystal layer,
the columnar spacer is disposed in an intersecting region where any one of the plurality of gate wiring lines and any one of the plurality of source wiring lines intersect, and
a front face of the active matrix substrate on the liquid crystal layer side includes
a first ridge overlapping one of the plurality of gate wiring lines and extending along the one of the plurality of gate wiring lines when viewed from a normal direction of a display surface,
a plurality of second ridges overlapping one of the plurality of source wiring lines when viewed from the normal direction of the display surface,
the columnar spacer is in contact with the first ridge,
the plurality of second ridges are located adjacent to each other with the first ridge provided between the plurality of second ridges, and
a height of each of the plurality of second ridges is greater than a height of the first ridge.

2. The liquid crystal display device according to claim 1, wherein the active matrix substrate further includes a plurality of base conductive layers provided below the interlayer insulating layer and overlapping the plurality of second ridges when viewed from the normal direction of the display surface.

3. The liquid crystal display device according to claim 2, wherein the plurality of base conductive layers are formed of the same conductive film as the plurality of gate wiring lines.

4. The liquid crystal display device according to claim 3, wherein the plurality of base conductive layers are not electrically connected to the plurality of gate wiring lines.

5. The liquid crystal display device according to claim 2, wherein the plurality of base conductive layers are formed of a conductive film different from that of the plurality of gate wiring lines.

6. The liquid crystal display device according to claim 5, wherein a thickness of each of the plurality of base conductive layers is greater than a thickness of each of the plurality of gate wiring lines.

7. The liquid crystal display device according to claim 2, wherein a width of each of the plurality of base conductive layers is less than or equal to a width of each of the plurality of source wiring lines.

8. The liquid crystal display device according to claim 1, wherein the active matrix substrate further includes a plurality of transparent insulating layers provided above or below the interlayer insulating layer and overlapping the plurality of second ridges when viewed from the normal direction of the display surface.

9. The liquid crystal display device according to claim 8, wherein the plurality of transparent insulating layers are provided above the interlayer insulating layer.

10. The liquid crystal display device according to claim 8, wherein the plurality of transparent insulating layers are not formed in the intersecting region.

11. The liquid crystal display device according to claim 1, wherein the active matrix substrate further includes a light blocking layer overlapping a channel region of the oxide semiconductor layer when viewed from the normal direction of the display surface.

12. The liquid crystal display device according to claim 11,
wherein the active matrix substrate further includes a lower insulating layer covering the light blocking layer, and
the plurality of source wiring lines and the oxide semiconductor layer are provided on the lower insulating layer.

13. The liquid crystal display device according to claim 1, further comprising:
a lower insulating layer covering the plurality of source wiring lines,
wherein the oxide semiconductor layer is provided on the lower insulating layer.

14. The liquid crystal display device according to claim 13,
wherein the active matrix substrate further includes a light blocking layer overlapping a channel region of the oxide semiconductor layer when viewed from the normal direction of the display surface, and
the light blocking layer is formed of the same conductive film as the plurality of source wiring lines.

15. The liquid crystal display device according to claim 1,
wherein the oxide semiconductor TFT includes a source electrode electrically connected to the oxide semiconductor layer, and the source electrode is integrally formed with any one of the plurality of source wiring lines.

16. The liquid crystal display device according to claim 1,
wherein the oxide semiconductor layer includes an In—Ga—Zn—O based semiconductor.

17. The liquid crystal display device according to claim 16,
wherein the In—Ga—Zn—O based semiconductor includes a crystalline portion.

* * * * *